United States Patent [19]

Peel

[11] 4,368,085

[45] Jan. 11, 1983

[54] SOS ISLAND EDGE PASSIVATION STRUCTURE

[75] Inventor: John L. Peel, Sandy, Utah

[73] Assignee: Rockwell International Corporation, El Segundo, Calif.

[21] Appl. No.: 166,950

[22] Filed: Jul. 8, 1980

Related U.S. Application Data

[62] Division of Ser. No. 85,148, Oct. 15, 1979, Pat. No. 4,242,156.

[51] Int. Cl.³ .............................................. H01L 27/12
[52] U.S. Cl. .................... 148/33.3; 29/571; 29/578; 148/175; 357/4; 357/23; 357/54; 357/56; H01L/29/78
[58] Field of Search .............. 148/33.3, 175; 29/571, 29/578; 357/4, 23, 54, 56

[56] References Cited

U.S. PATENT DOCUMENTS

| | | | |
|---|---|---|---|
| 3,740,280 | 6/1973 | Ram Shaul Ronen . | |
| 4,057,824 | 11/1977 | Woods | 357/59 X |
| 4,097,314 | 6/1978 | Schlesier et al. | 148/188 |
| 4,174,217 | 11/1979 | Flatley | 357/59 X |
| 4,199,384 | 4/1980 | Hsu | 148/174 |
| 4,263,709 | 4/1981 | Weitzel et al. | 29/578 X |

FOREIGN PATENT DOCUMENTS

| | | |
|---|---|---|
| 2254104 | 12/1974 | France . |
| 2280979 | 8/1975 | France . |
| 2284988 | 9/1975 | France . |

OTHER PUBLICATIONS

Proceedings of the 8th Conference ('76 International) On Solid State Devices in Japanese Journal of Applied Physics, vol. 16, 1977, Supplement 16-1, Tokyo, Y Sakai et al: "A New Isolation Technique for SOS/LSI's-Local Buried Oxide Isolation of SOS (LOBOS)," pp. 551-555.

*Primary Examiner*—L. Dewayne Rutledge
*Assistant Examiner*—W. G. Saba
*Attorney, Agent, or Firm*—H. Fredrick Hamann; Daniel R. McGlynn

[57] ABSTRACT

A silicon-on-sapphire semiconductor structure, and method of fabricating such structure, in which a silicone nitride layer is provided over the oxide layer. The silicon nitride layer is disposed over the upper edge of the silicon island, and acts to prevent gate oxide breakdown.

1 Claim, 9 Drawing Figures

SOS ISLAND EDGE PASSIVATION STRUCTURE

REFERENCE TO RELATED APPLICATIONS

This is a division of application Ser. No. 085,148, filed Oct. 15, 1979, now U.S. Pat. No. 4,242,156, issued December 30, 1980.

BACKGROUND OF THE INVENTION

1. Field of the Invention

The invention relates to silicon-on-sapphire (SOS) semiconductor devices, and in particular to structures for SOS devices which operate at high operating voltages.

2. Description of the Prior Art

The typical prior art SOS semiconductor device structure consists of a silicon island on a sapphire substrate. A gate oxide is grown on the surface of the silicon island, and gate metal is deposited thereover. The thickness of the oxide at the island edge is typically only 400 A.

Although for many device applications such prior art structures are acceptable for SOS circuits with high operating voltages, such structures are disadvantageous. The relatively thin oxide thickness is a frequent source of circuit failure due to oxide breakdown.

Prior to the present invention there has not been a simple and easy-to-fabricate SOS semiconductor device structure which is relatively immune to oxide breakdown.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

DESCRIPTION OF THE PREFERRED EMBODIMENT

Figure 1:
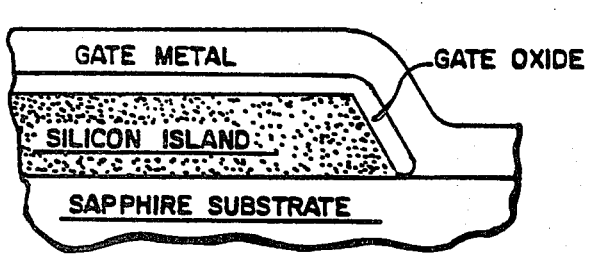
FIG. 1 is a highly simplified cross-section of an SOS semiconductor device structure according to the prior art.

Turning now to FIG. 1 there is shown a highly simplified cross-sectional view of an SOS semiconductor structure according to the prior art. The FIGURE indicates a silicon island disposed on the major surface of a sapphire substrate with a gate oxide layer grown over the top surface of the silicon island. Over the gate oxide, as well as over the sapphire substrate is placed a gate metal for forming a gate electrode of a field effect transistor to be formed therein. As pointed out above, the relatively thin gate oxide layer is particularly susceptible to failure due to oxide breakdown.

Figure 2:
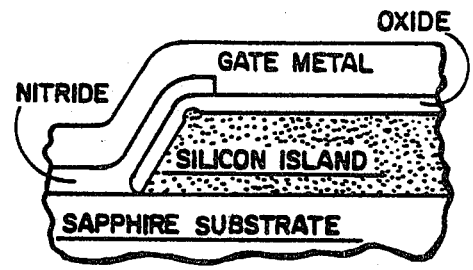
FIG. 2 is a highly simplified cross-section of an SOS semiconductor device structure according to the present invention.

FIG. 2 is a highly simplified cross-sectional view of an SOS semiconductor device structure according to the present invention. There is shown a similar silicon island disposed on the major surface of a sapphire substrate with a gate oxide layer disposed over the exposed major surface of the silicon island, i.e. a top portion and a side portion. A chemical vapor deposited (CVD) nitride layer is disposed over the surface of the sapphire substrate as well as the gate oxide located over the side or end portion and corner edge of the silicon island. Finally, over the surface of the gate oxide on the top surface of the silicon island, as well as over the CVD nitride layer, a layer of gate metal is disposed.

In a typical example the device according to the present invention is used in an MNOS memory circuit in which the silicon nitride layer, shown in the diagram, may be the same silicon nitride layer deposited for the memory gate insulator.

In a preferred embodiment, the silicon nitride layer in FIG. 2 is approximately 300–800 Å in thickness, so that on top of the thermal oxide layer which is from 100–800 Å in thickness, a relatively thick layer is provided over the edge of the silicon island which prevents oxide breakdown and circuit failure.

A controlled test at 260° C. using 830 Å oxides and nitride thickness layers were done which compared devices with edge protection and without edge protection, at applied voltages ranging from 25–35 volts. Devices without edge protection after a period between 1–10 hours began to show rapidly increasing failures with a number of surviving devices approaching zero after two hours for the applied voltage of 35 volts and approaching zero after 12 hours with an applied voltage of −35 volts. A comparative situation with edge protected devices showed no failures.

Turning now to FIG. 3 there is shown a sequence of steps for fabricating the device according to the present invention.

Figure 3A:
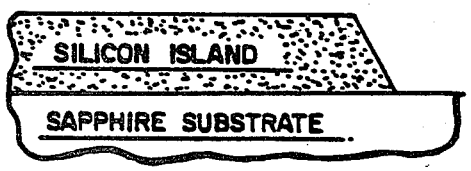
FIG. 3(a) shows the first step in the fabrication process for producing the semiconductor device according to the present invention, in which a silicon layer on a sapphire substrate is etched to form an island.

FIG. 3(a) shows the first step in the fabrication process for producing the semiconductor device according to the present invention, in which a silicon layer on a sapphire substrate is etched to form an island.

Figure 3B:
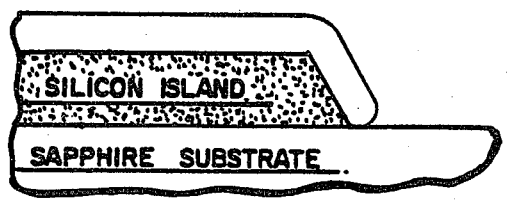
FIG. 3(b) shows the second step in the fabrication process for producing the semiconductor device according to the present invention, in which an oxide layer is grown over the silicon island.

FIG. 3(b) shows the second step in the fabrication process for producing the semiconductor device according to the present invention, in which a first oxide layer is grown over the silicon island.

Figure 3C:
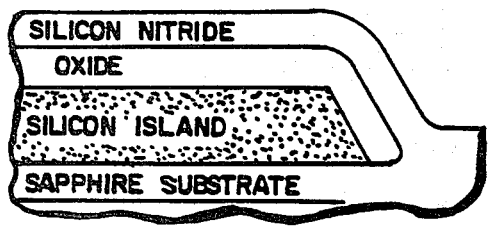
FIG. 3(c) shows the third step in the fabrication process for producing the semiconductor device according to the present invention, in which a silicon nitride layer is deposited over the oxide layer and the sapphire substrate.

FIG. 3(c) shows the third step in the fabrication process for producing the semiconductor device according to the present invention, in which a silicon nitride layer is deposited entirely over the oxide layer over the silicon island, as well as over the sapphire substrate. The preferred method of deposition is by chemical vapor deposition (CVD).

Figure 3D:
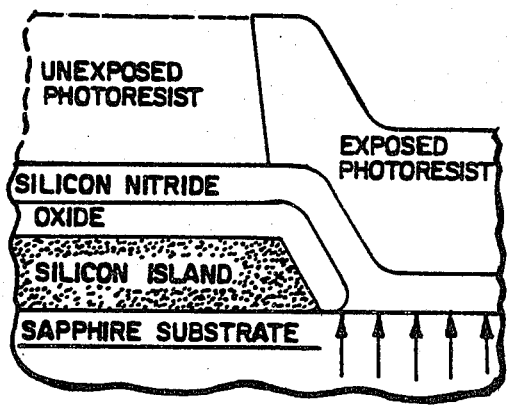
FIG. 3(d) shows the fourth step in the fabrication process for producing the semiconductor device according to the present invention, in which a photoresist layer is applied over the silicon nitride layer and exposed from the backside.

FIG. 3(d) shows the fourth step in the fabrication process for producing the semiconductor device according to the present invention, in which a photoresist layer is applied over the silicon nitride layer and exposed from the backside.

Figure 3E:
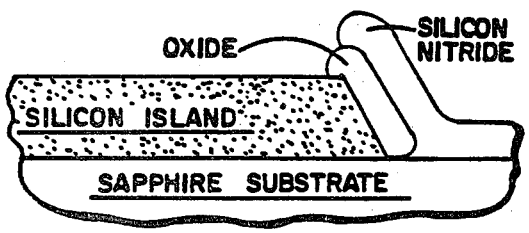
FIG. 3(e) shows the fifth step in the fabrication process for producing the semiconductor device according to the present invention, in which the silicon nitride and oxide layer on the top major surface of the silicon island is etched to bare silicon.

FIG. 3(e) shows the fifth step in the fabrication process for producing the semiconductor device according to the present invention, in which the silicon nitride and oxide layer on the top major surface of the silicon island is etched to bare silicon.

Figure 3F:
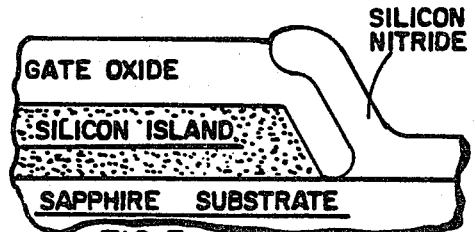
FIG. 3(f) shows the sixth step in the fabrication process for producing the semiconductor device according to the present invention, in which gate oxide is grown over the silicon island.

FIG. 3(f) shows the sixth step in the fabrication process for producing the semiconductor device according to the present invention, in which a second or gate oxide layer is grown over the exposed top surface of the silicon island.

Figure 3G:
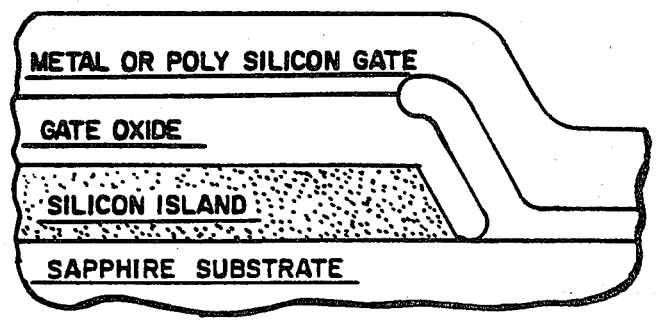
FIG. 3(g) shows the final step in which a metal or polysilicon electrode is deposited over the gate oxide.

FIG. 3(g) shows the final step in which a conductive layer (e.g., metal or polysilicon) is deposited over the second oxide layer.

The use of such semiconductor structures in the formation of active devices would be known to those skilled in the art, and need not be elaborated here.

While the invention has been illustrated and described as embodied in an SOS island edge passivation structure and method of fabrication, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitutes essential characteristics of the generic or specific aspects of this invention, and, therefore, such adaptations should and are intended to be comprehended within the meaning and range of equivalence of the following claims.

What is claimed is:

1. A silicon-on-sapphire semiconductor structure comprising:

a sapphire substrate;

a silicon island disposed on said sapphire substrate, having a major surface including an upper first surface and a side second surface separated by an edge;

an oxide layer disposed entirely over said major surface of said silicon island; and a silicon nitride layer disposed entirely over said side second surface and in part over said upper first surface, the nitride layer extending over a portion of said upper first surface so that said nitride layer covers the edge between said upper first surface and said side second surface.

* * * * *